(12) United States Patent
Yamashita et al.

(10) Patent No.: US 9,923,013 B1
(45) Date of Patent: Mar. 20, 2018

(54) SENSOR DEVICE, IMAGE SENSOR ARRAY AND MANUFACTURING METHOD OF SENSOR DEVICE

(71) Applicant: TAIWAN SEMICONDUCTOR MANUFACTURING COMPANY LTD., Hsinchu (TW)

(72) Inventors: Yuichiro Yamashita, Hsinchu (TW); Kuo-Chin Huang, Yilan County (TW); Tzu-Jui Wang, Kaohsiung (TW); Alexander Kalnitsky, San Francisco, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/356,287

(22) Filed: Nov. 18, 2016

(51) Int. Cl.
| | |
|---|---|
| *H01L 21/00* | (2006.01) |
| *H01L 27/146* | (2006.01) |
| *H01L 31/105* | (2006.01) |
| *H01L 31/0304* | (2006.01) |

(52) U.S. Cl.
CPC .... *H01L 27/14643* (2013.01); *H01L 27/1463* (2013.01); *H01L 27/14614* (2013.01); *H01L 27/14634* (2013.01); *H01L 27/14636* (2013.01); *H01L 27/14689* (2013.01); *H01L 27/14694* (2013.01); *H01L 31/03046* (2013.01); *H01L 31/105* (2013.01)

(58) Field of Classification Search
None
See application file for complete search history.

(56) References Cited

U.S. PATENT DOCUMENTS

| | | | | |
|---|---|---|---|---|
| 8,022,390 B1 * | 9/2011 | Kim | .................... | H01L 27/1446 250/332 |
| 2009/0321868 A1 * | 12/2009 | Nakaji | .................. | H01L 31/105 257/458 |
| 2011/0024859 A1 * | 2/2011 | Miyazaki | .......... | H01L 27/14645 257/432 |

OTHER PUBLICATIONS

A.I. D'Souza et al., Electrooptical Characterization of MWIR InAsSb Detectors, Journal of Electronic Materials, vol. 41, No. 10, 2012.
Nibir K. Dhar et al., Advances in Infrared Detector Array Technology, Optoelectronics—Advanced Materials and Devices.

* cited by examiner

*Primary Examiner* — Reema Patel
(74) *Attorney, Agent, or Firm* — WPAT, P.C., Intellectual Property Attorneys; Anthony King

(57) ABSTRACT

A sensor device is disclosed. The sensor device include: a detector having a contact formation region; an insulating layer disposed over the detector; a conductive pad disposed over the insulating layer opposite to a side of the detector; a contact plug formed in the insulating layer for electrically coupling the contact implant region and the conductive pad; and a read-out integrated circuit bonded to the insulating layer through the conductive pad. An image sensor array and a manufacturing method of a sensor device are also disclosed.

17 Claims, 15 Drawing Sheets

SENSOR DEVICE, IMAGE SENSOR ARRAY AND MANUFACTURING METHOD OF SENSOR DEVICE

BACKGROUND

Solid-state imaging devices with higher resolution are used in many commercial applications especially camera and also for other light imaging uses. Such imaging devices typically comprise of CCD (charge coupled device) photo detector arrays with associated switching elements, and address (scan) and read out (data) lines. This CCD technology is matured so much that now days millions of pixels and surrounding circuitry can be fabricated using the CMOS (complementary metal oxide semiconductor) technology. As today's CCD technology is based on silicon (Si)-technology, the detectable spectral ranges of CCD are limited to the wavelengths below 1 µm where Si exhibits absorption. Besides, CCD based imaging technique has also other shortcomings such as high efficiency response combined with high quantum efficiency over broad spectral ranges. This broad spectral detection is required in many applications. One of them is the free space laser communication where shorter (in visible ranges) and near infrared wavelengths is expected to be used. Image sensor array having broad spectral detection capability, disclosed in this invention, is expected to provide those features not available in today's CCD and other imaging (e.g. InGaAs, HgCdTe, or PbS) technologies. With well design of the array, appreciable resolution can also be achieved in image sensor array technology.

Detectors (a.k.a. photodiode or sensor pixel) especially of p/intrinsic/n (p-i-n) type conductivity have been studied extensively over the last decade for its application in optical communication. These photodiodes are for near infrared detection, especially the wavelength vicinity to 1310 and 1550 nm, where today's optical communication is dealt with. Present short-wave infrared (SWIR) p-i-n photodiodes usually suffers serious dark currents, wherein some of them are contributed by the existing indium bump structure. Thus, minimizing the dark current would be desirable to improve the overall performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
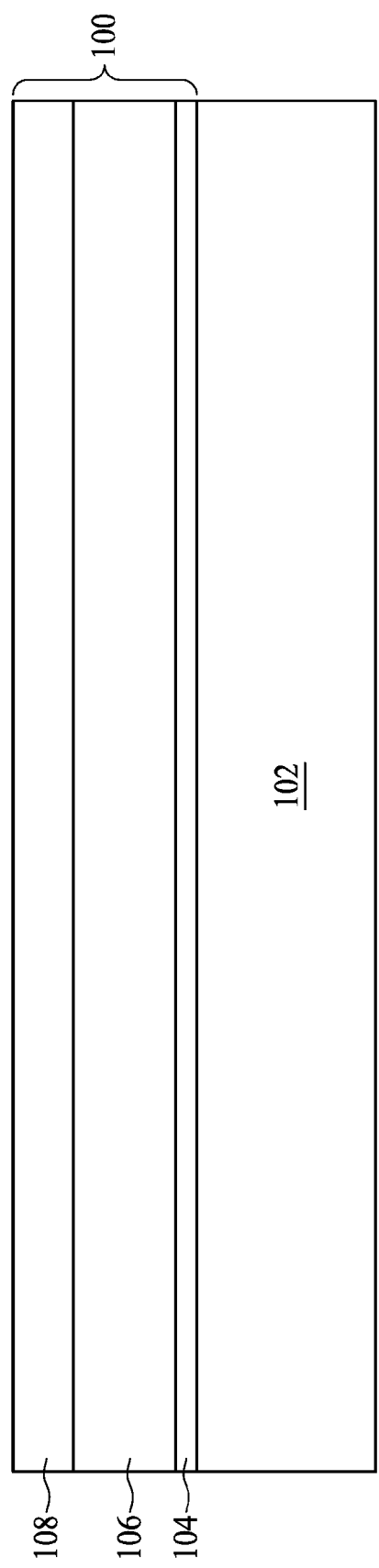
FIGS. 1 to 13b are the cross-section views showing alternative fabrication process of the sensor device in accordance with the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1 to 13b are the cross-section views showing alternative fabrication process of the sensor device in accordance with the present disclosure wherein the same parts are represented by the same numerals so that repeated explanation is omitted here. This fabrication process described here is only for an example, not for the limitation. The structure and design mentioned here, may be for both top (also mentioned as 'front')-illuminated and bottom (also mentioned as 'back')-illuminated type image sensor and their array may have broad spectral detection ranges. The spectral array may be made from any material systems such as Si, Ge, SiGe, GaN, GaAs, InP, InGaAs, InAs, HgCdTe, CdTe, ZnCdTe, PbS etc. This may cover all sensor and its array with broad spectral detection ranges which covers from <300 nm (or as low as UV to long-Infrared (10 µm and more longer) wavelengths range. This disclosure also covers the sensors and their array's transferring technology to the independent substrate, bonding technology, and also covering their broadband optics system and their configuration, necessary for the broadband camera system.

Today's image sensor system made from any material systems (e.g. Si, Ge, Si:Ge, InP, GaAs, InSb etc.) comprising with image sensor array, read-out integrated circuit (ROIC), and optics systems which makes image transfer to electronics and their signal processing. Image sensor array (a.k.a. detector array) made from any material systems are mainly made from p-n or p-i-n structure and their junction is made from the bulk semiconductor material systems and they are made specifically for the specific spectral band. For example, (i) Si based p-i-n image sensor cover spectral band only in the visible ranges covering from 400 nm to 780 nm, (ii) image sensor made from GaAs cover only 400 to 850 nm, (iii) InP based image sensor cover only 980 nm to 1700 nm, (iv) InSb based image sensor covers only 3.0 to 5.0 µm, and (v) HgCdTe based image sensor cover 1.0 to 10 µm. Every material system can be used for making the detector element utilizing other material system. For easiness and simplicity in discussion, InP based material system is cited here. However, as mentioned above, this covers also other material systems such as GaN, Si, SiGe, GaAs, InP, InAs, HgCdTe, PbS, etc.

In FIG. 1, a semiconductor substrate 102 is provided. The semiconductor substrate 102 used here may be a thick substrate. In the exemplary embodiment, for making a p-i-n detector structure 100 as illustrated in FIG. 1, a required first InP layer 104, an InGaAs layer 106 for absorption of light in the range of 0.9 to 1.7 µm wavelengths, as well as a second InP layer 108 for carrier collection are deposited on the semiconductor substrate 102 using standard deposition techniques. Please note that depending on the detector architecture, the deposition techniques or crystal growth strategies may include any of the following techniques: Bulk Crystal Growth, Liquid Phase Epitaxy (LPE), Metal-organic Chemical Vapor Deposition (MOCVD), and Molecular Beam Epitaxy (MBE).

Figure 2:
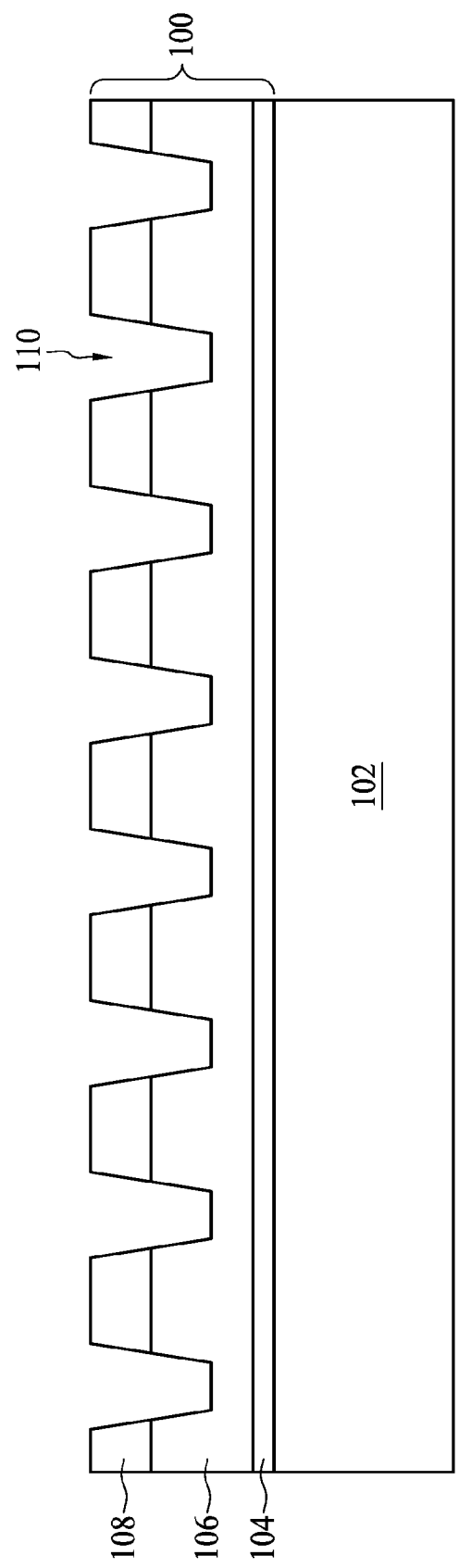

In FIG. 2, at least a portion of the p-i-n detector structure 100 is patterned and dry etched in order to form p-i-n detector mesa structures. Each mesa represents a single pixel, and each pixel is separated from neighboring pixels by recesses or spaces 110. In some embodiments, the recesses or spaces 110 may be down to the first InP layer 104 or even the semiconductor substrate 102. In some embodiments, patterning may be made utilizing electron beam (EB) patterning technique. In some embodiments, patterning may be accomplished by nano-imprinting utilizing the master mold. Dry etching technique is used to make the mesa structures. Standard resist or any mask material can be used in dry etching process.

Figure 3:
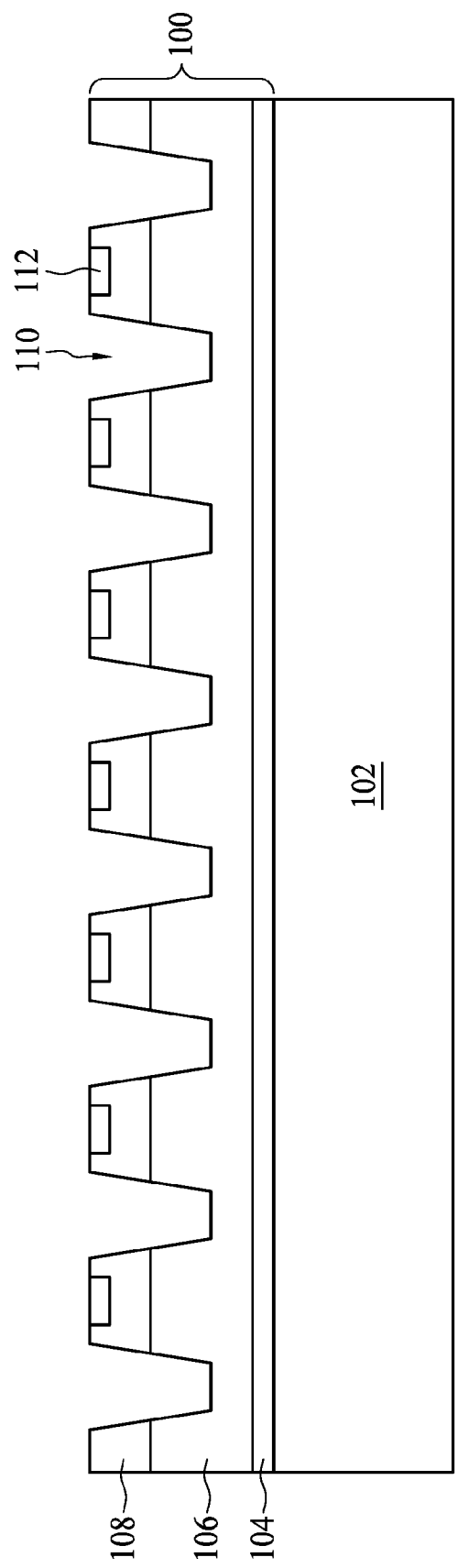

In FIG. 3, contact implant regions 112 are defined in the top of the second InP layer 108 by performing an appropriate dopant ion implantation of a doping type the same with the second InP layer 108, using conventional techniques known to those of skill in the art, taking into account the composition of the protection layer. In some embodiments, an encapsulation protection layer (not shown), i.e., a dielectric layer, may be disposed on the top surface of the second InP layer 108 before the ion implantation. This protection layer allows implantation therethrough while preventing damage of the exposed surface of the p-i-n detector structure 100. Examples of a suitable protection layer include a SiO2 or SiN layer deposited by a CVD process, e.g., MOCVD, or an Al2O3 layer or a nanolaminate layer, including a material such as HfO2 and/or HfAlO, deposited by ALD. A mask (not shown) may be subsequently formed above the protection layer, and used to define the contact implant regions 112. The mask may be formed from a suitable masking material, such as a dielectric material, e.g., Si3N4, in accordance with methods known to one of skill in the art. In some embodiments, an anneal may be then performed at a suitably high temperature to activate the implanted dopant, for example between about 600 and 900° C., with rapid thermal processing ("RTP"). The encapsulation protection layer is able to protect the InP-based material surface during the implantation and anneal processes. The encapsulation protection layer may be removed after the implantation and anneal steps to create the p-i-n detector structure 100 as shown in FIG. 3 with the contact implant regions 112 respectively formed at the top portion of the p-i-n detector mesa structures.

In some embodiments, a diameter of each of the contact implant regions 112 may be about 0.1 to about 0.5 microns. However, this is not a limitation of the present disclosure. In the exemplary embodiment, the fabrication process may jump from FIG. 3 to FIG. 5 by forming an insulator or semiconductor material 114 on the p-i-n detector structure 100 and filling the recesses or spaces 110 between the p-i-n detector mesa structures. Standard polymer (or monomer) material having less or no absorption of wavelengths of interest can be used. Silicon oxide or silicon nitride utilizing the chemical vapor deposition can also be used as the filler material. Sol-gel silicon oxide can also be used alternatively.

In some embodiments, the p-i-n detector structure 100 may be further processed before forming the insulator or semiconductor material 114. Referring back to FIG. 4a, a semiconductor layer 116 of a doping type different from the second InP layer 108 may be formed on sidewalls and bottoms of the recesses or spaces 110. For example, the second InP layer 108 is N-type and the semiconductor layer 116 is P-type. In this case, the P-type semiconductor layer 116 provides further holes to trap electrons, thereby reducing the induced dark current. In the embodiment, the semiconductor layer 116 includes InP. However, this is not a limitation of the present disclosure. The semiconductor layer 116 may be made from any suitable material. In some embodiments the recesses or spaces 110 extending to the first InP layer 104 or even the semiconductor substrate 102, the semiconductor layer 116 may extend to the first InP layer 104 or even the semiconductor substrate 102 as well.

Figure 4A:
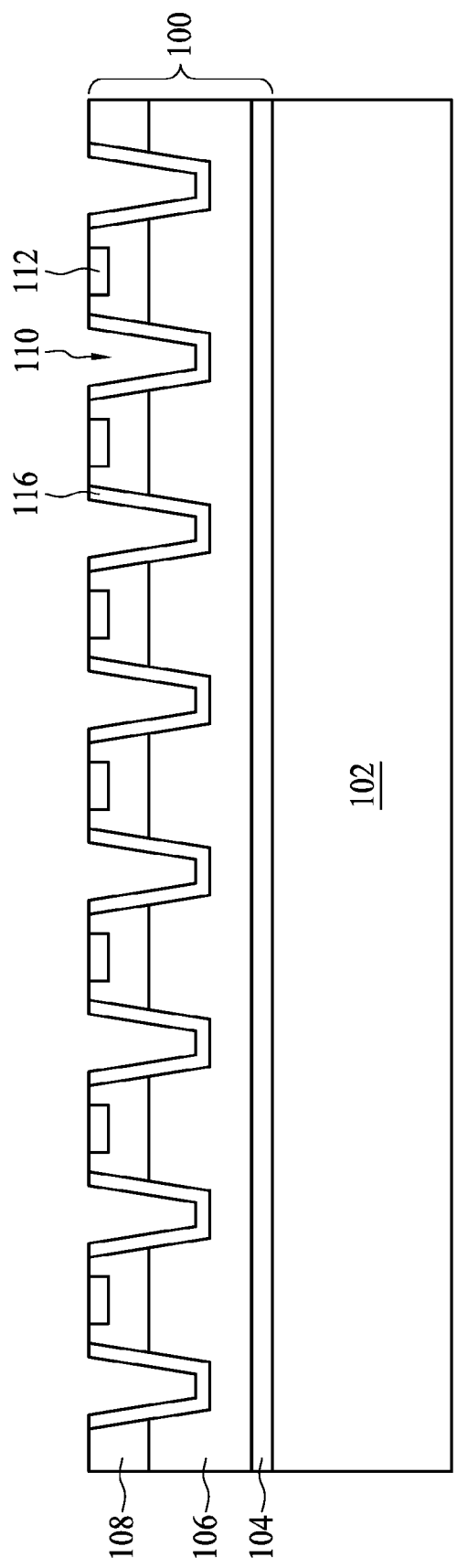
Figure 4B:
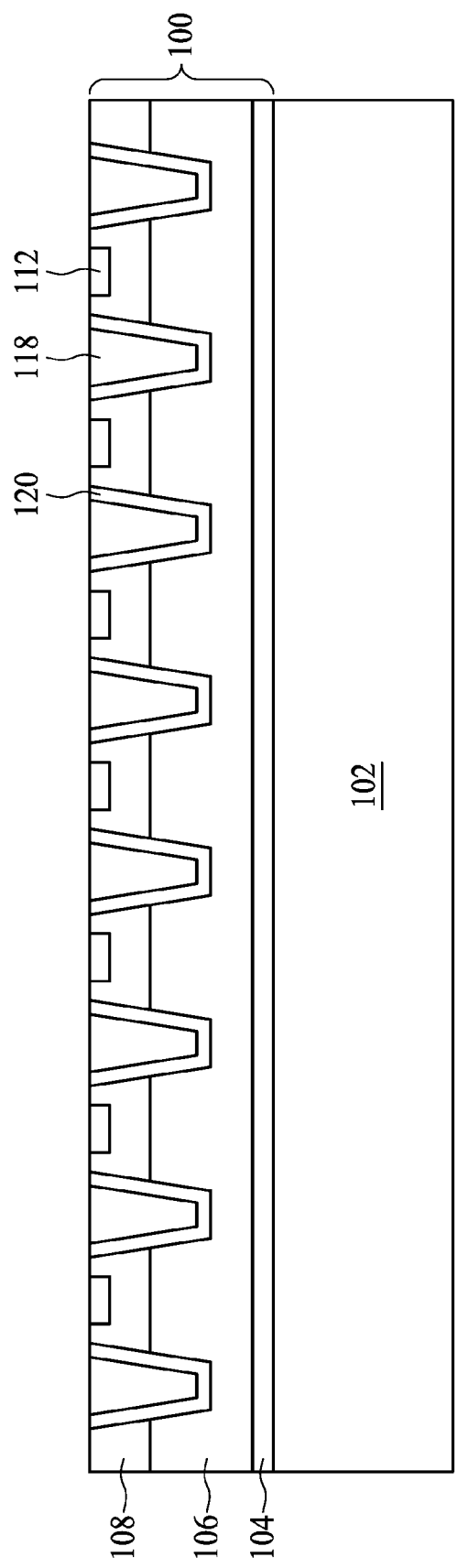
Figure 5:
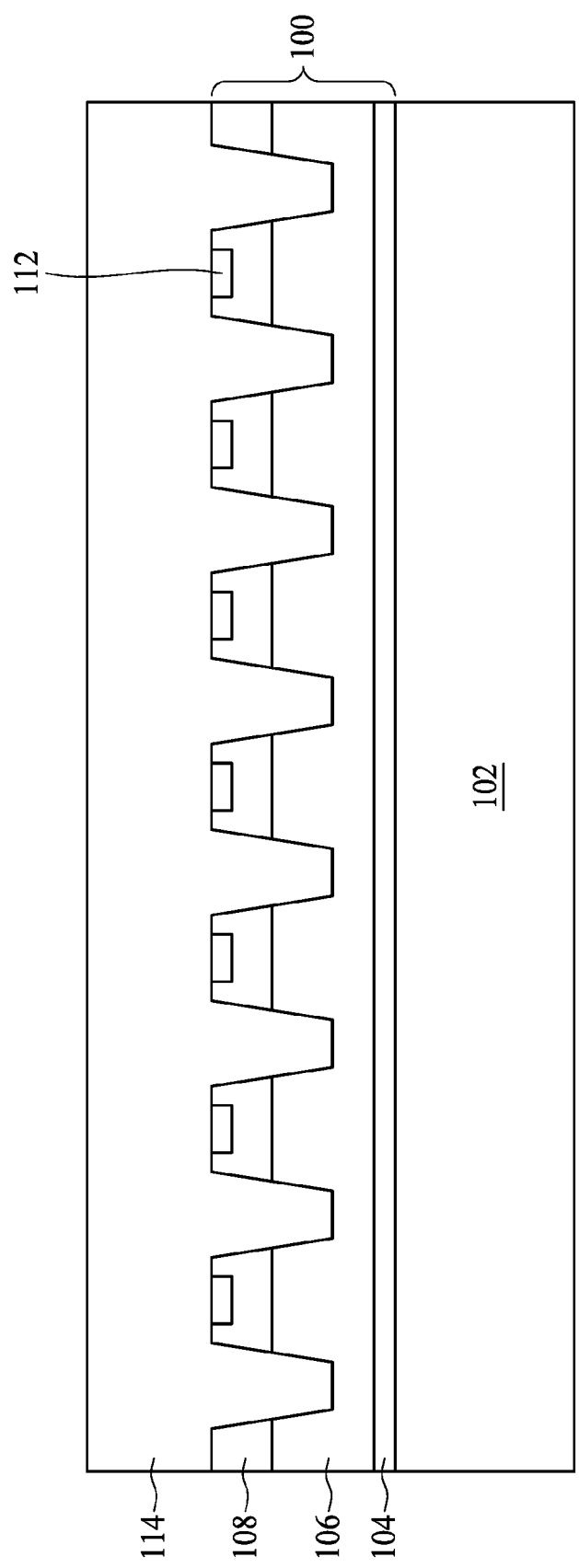

Referring to FIG. 4b, another embodiment with further processed p-i-n detector structure 100 before formation of the insulator or semiconductor material 114 of FIG. 5 is provided as an option. In FIG. 4b, a gate oxide layer 120 and a gate electrode layer 118 may be formed in the recesses or spaces 110 sequentially. For example, during an operation of the final sensor device, the gate electrode layer 120 may be biased to a negative voltage when the second InP layer 108 is N-type. In this way, holes may be induced and gathering around the interface between the gate oxide layer 120 and the mesa structures to trap electrons, thereby reducing the induced dark current.

In some embodiments, the gate oxide layer may be formed to a thickness of between about 15 Angstroms and 200 Angstroms using thermal oxidation at a temperature of between about 650° C. and 1000° C. for a time of between about 5 seconds and 3600 seconds. The gate electrode layer 118 is formed over the gate oxide layer 120, having a sufficient thickness to fill the recesses or spaces 110. The gate electrode layer 118 may be composed of a metal selected from the group comprising titanium, tungsten, or aluminum. The gate electrode layer 118 may be formed using plasma enhanced chemical vapor deposition, sputtering or most preferably chemical vapor deposition. In some embodiments, a barrier layer of titanium nitride underlying the titanium, tungsten, or aluminum may be formed as well.

In some embodiments, the gate electrode layer 118 may be further planarized, stopping on the top surface of the p-i-n detector structure 100. The gate electrode layer 118 may be planarized using chemical mechanical polishing or by a metal etch back.

Figure 6:
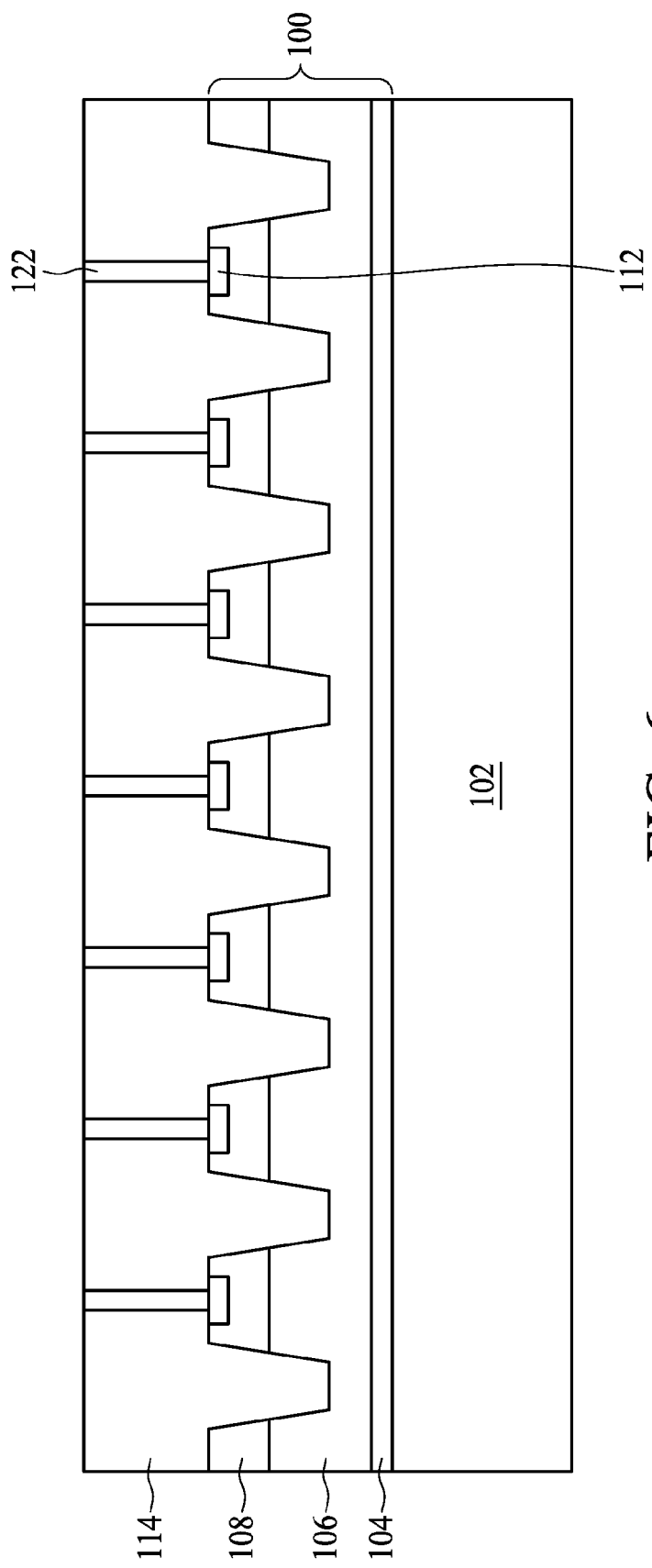

Referring to FIG. 6, contact plugs 122 are defined in the insulator or semiconductor material 114 by first forming openings by, for example, photolithographic and anisotropic reactive ion etching (RIE) procedures. However, this is not a limitation of the present disclosure. Then, the contact plugs 122 are formed in openings. This is accomplished via deposition of a conductive layer, such as an arsenic or phosphorous, in situ doped polysilicon layer, using LPCVD procedures completely filling the openings. Removal of in situ doped polysilicon layer from the top surface of the insulator or semiconductor material 114 may be accomplished via a CMP procedure, or via a selective RIE procedure, using $Cl_2$ as an etchant for polysilicon, resulting in the contact plugs 122.

Figure 7:
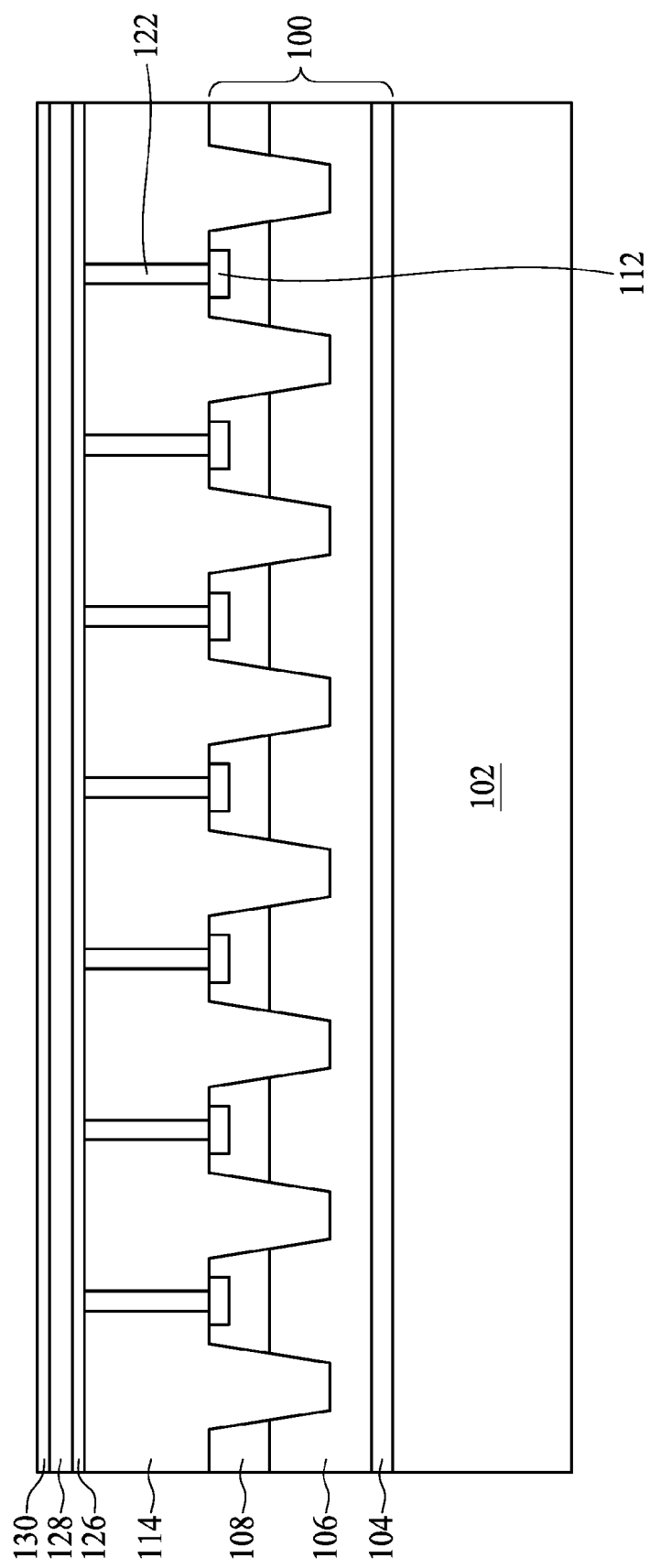

In FIG. 7, an etch stop layer 126, a dielectric material (or layer) 128, and a protective layer 130 are sequentially deposited over the surface of the insulator or semiconductor material 114. The etch stop layer 126 is a dielectric film and is used as an etch stop during an etching process for patterning an opening of conductive pad in the following steps. In some embodiments, the etch stop layer 126 is made of SiC with a thickness in a range from about 10 angstroms to about 5000 angstroms. In some embodiments, the insulating material 128 is made of $SiO_2$ with a thickness in a range from about 50 angstroms to about 10,000 angstroms. The protective layer 130 is made of SiN or SiON with a thickness in a range from about 5 angstroms to about 1000 angstroms, in accordance with some embodiments.

Figure 8:
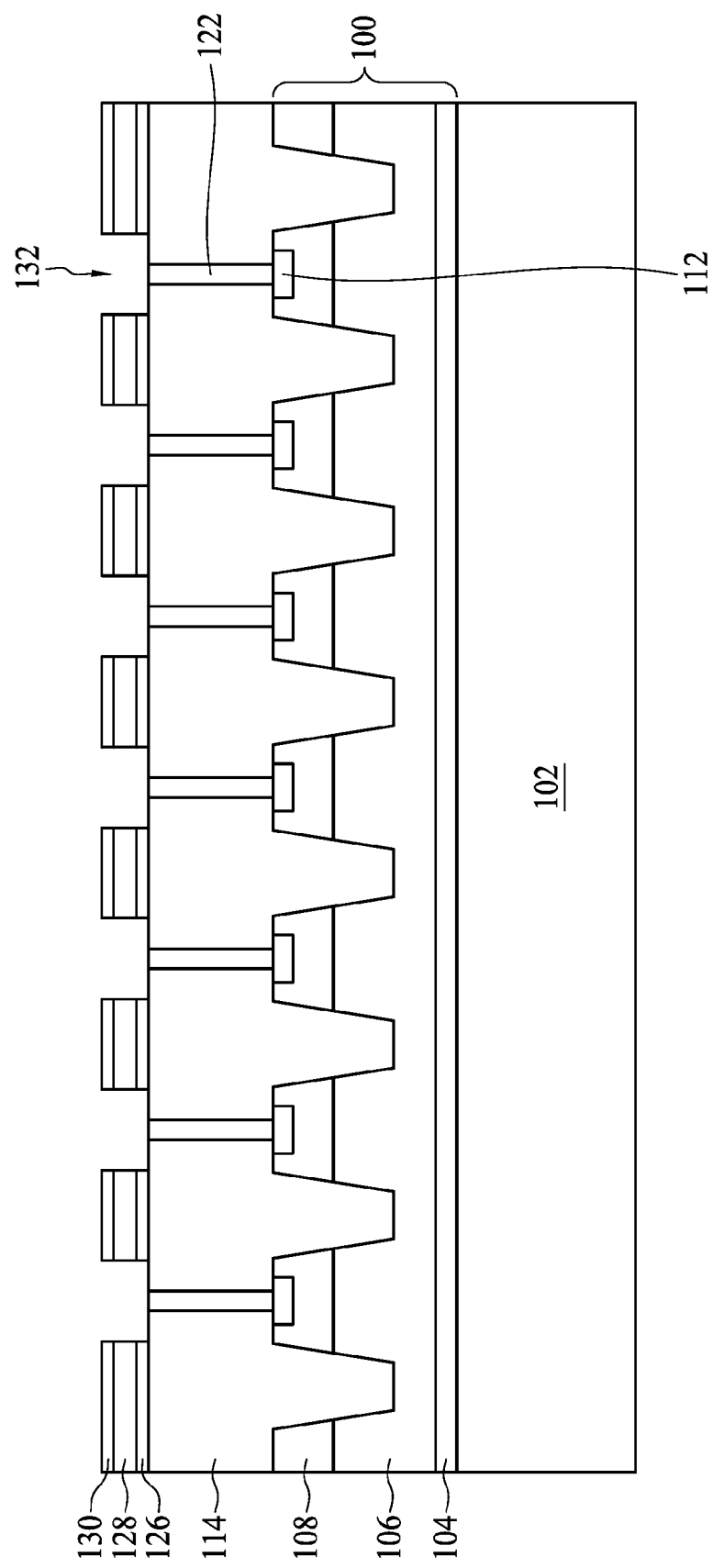
Figure 9:
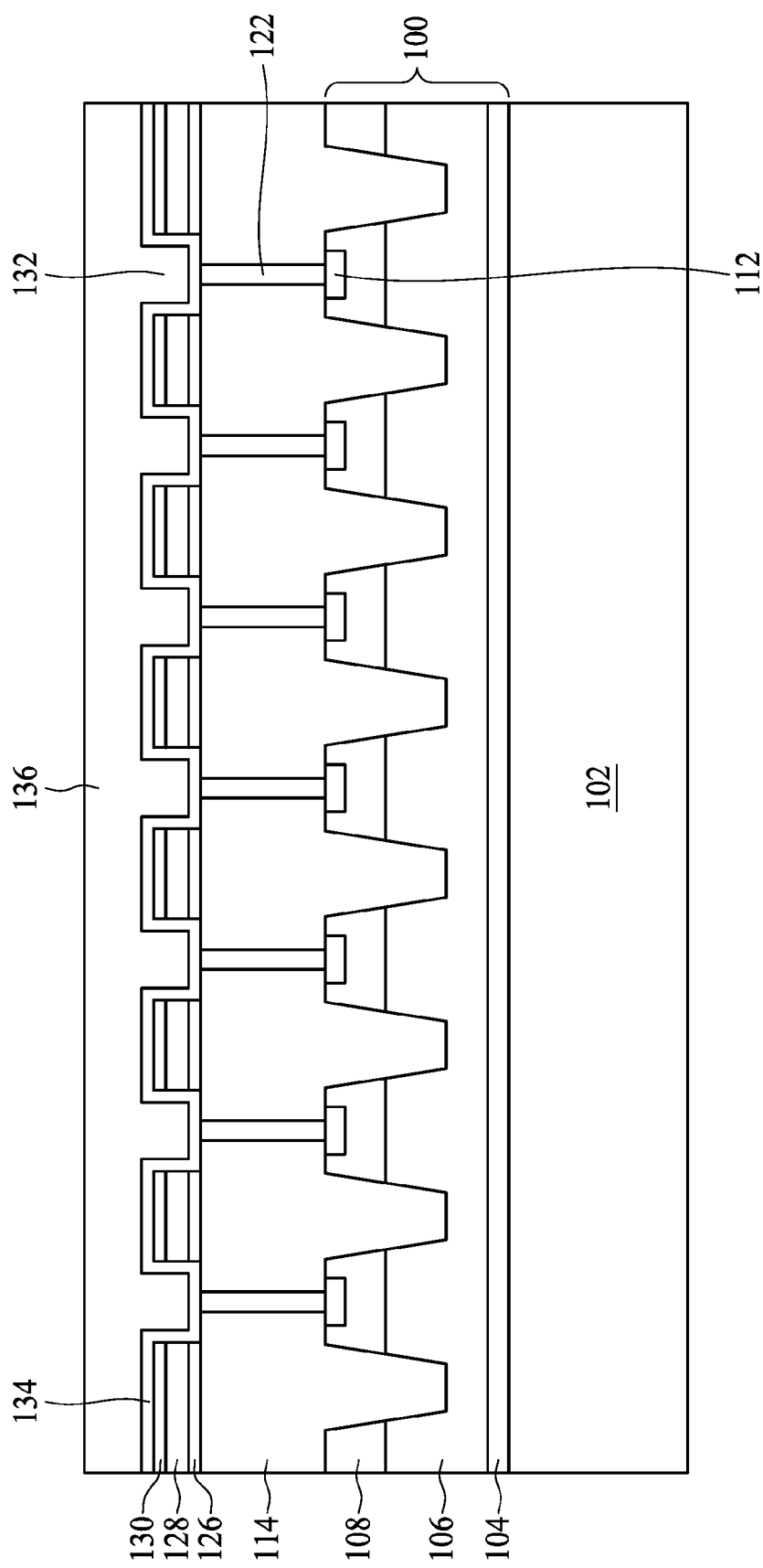

After the dielectric layers 126, 128 and 130 are deposited, openings 132 are formed via patterning and etching processes, as shown in FIG. 8 in accordance with some embodiments. The openings 132 expose tops of the contact plugs 122. After the openings 132 are formed, a barrier layer 134 is deposited to line openings 132 followed by depositing a conductive material 136, such as copper or copper alloy, to fill openings 132. In some embodiments, the barrier layer 134 is made of TaN with a thickness in a range from about 50 angstroms to about 1000 angstroms. The TaN may be formed by physical vapor deposition (PVD) or other applicable methods. A thin copper seed layer (not shown) may be deposited on the barrier layer 134 to assist the formation of the conductive material (layer) 136. The thin copper seed layer is deposited by PVD with a thickness in a range from about 10 angstroms to about 500 angstroms. The copper-containing conductive material 136 is deposited by a plating process, in accordance with some embodiments. The copper seed layer is not shown in FIG. 9 because the copper seed layer merges with the copper-containing conductive material 136 that fills openings 132.

Figure 10:
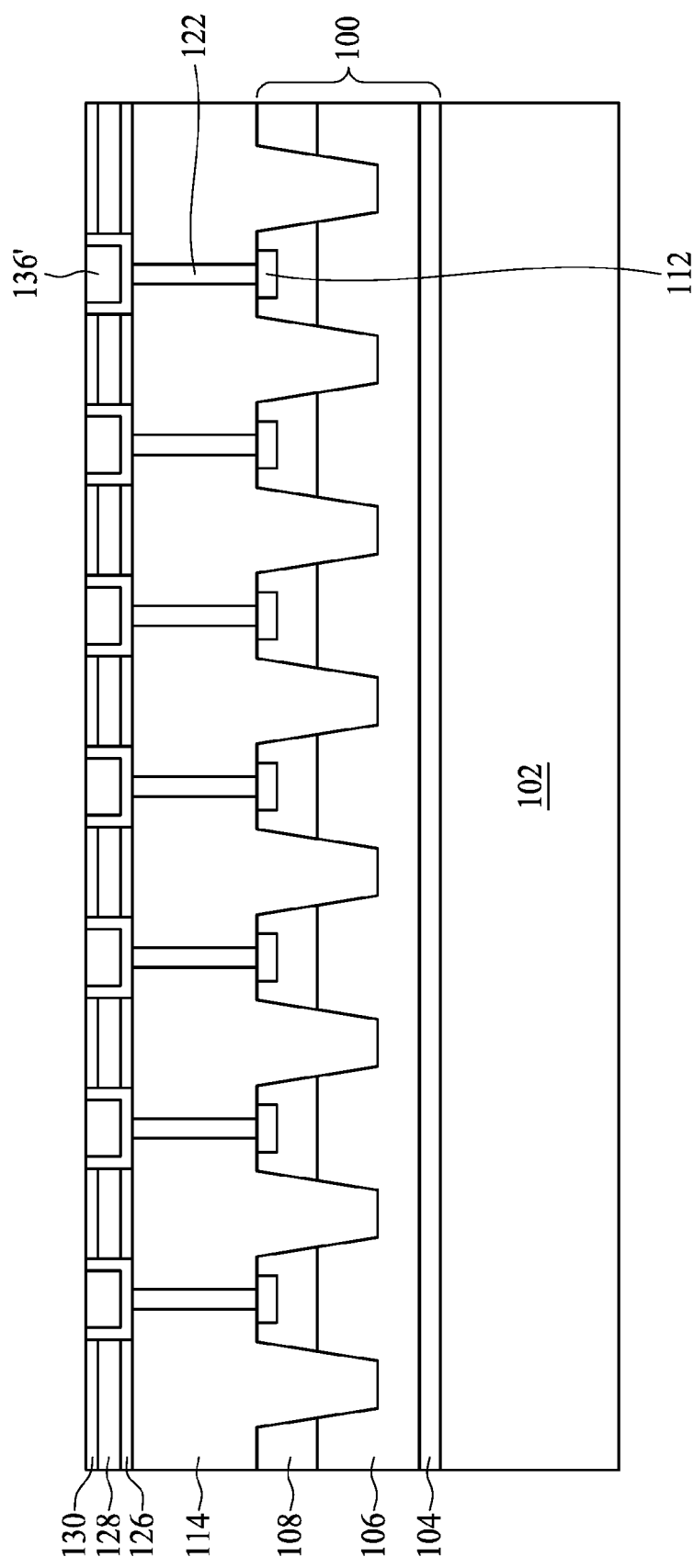
Figure 11:
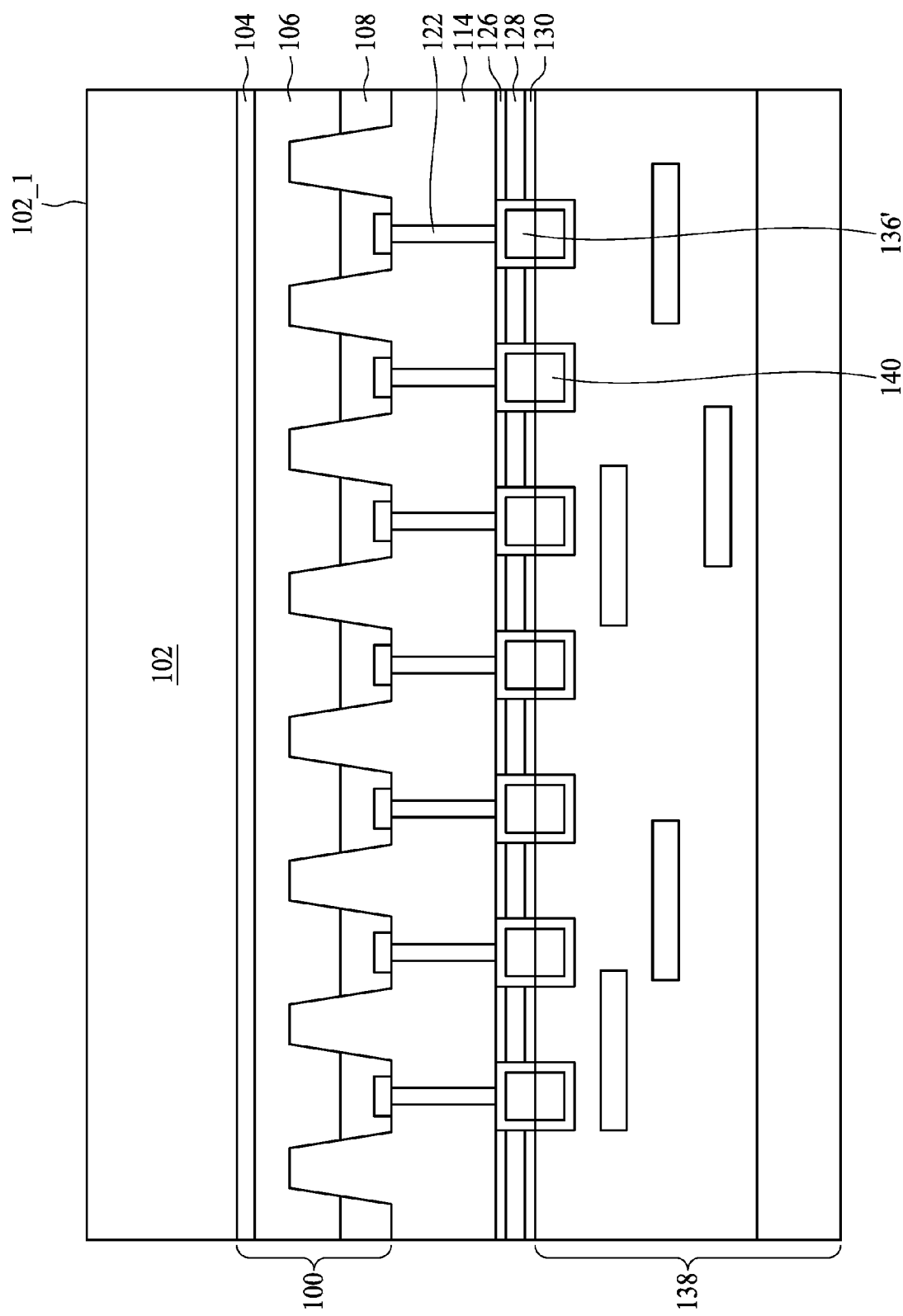

The copper-containing conductive material 136 and barrier layer 134 outside the openings 132 is then removed, such as by a chemical-mechanical polishing process, or an etching process as shown in FIG. 10. In this way, conductive pads 136' are formed. As can be seen that the protective layer 130 is exposed after the removal process. In FIG. 11, the image sensor array of FIG. 10 is hybrid bonded to a read-out integrated circuit (ROIC) 138, in accordance with some embodiments. FIG. 11 shows a width of the conductive pads 136' is about the same as a width of conductive pads 140 of the ROIC 138. The image sensor array and ROIC 138 are hybrid bonded together to form a sensor device by the application of pressure and heat. In some embodiments, during hybrid bonding, the sensor device is heated to a temperature in a range from about 100° C. to about 200° C., such that polymer materials at the interface between the image sensor array and ROIC 138 become a non-confined viscous liquid and are reflowed. By reflowing the polymer materials, voids therein are eliminated.

Afterwards, the sensor device are further heated to a higher temperature in a range from about 220° C. to about 380° C., such that the conductive pads 136' and 140 are interconnected by thermocompression bonding and the polymer materials are fully cured. In some embodiments, the pressure for hybrid bonding is in a range from about 0.7 bar to about 10 bar. The hybrid bonding process may be performed in an inert environment, such as an environment filled with inert gas including N2, Ar, He, or combinations thereof.

Figure 12:
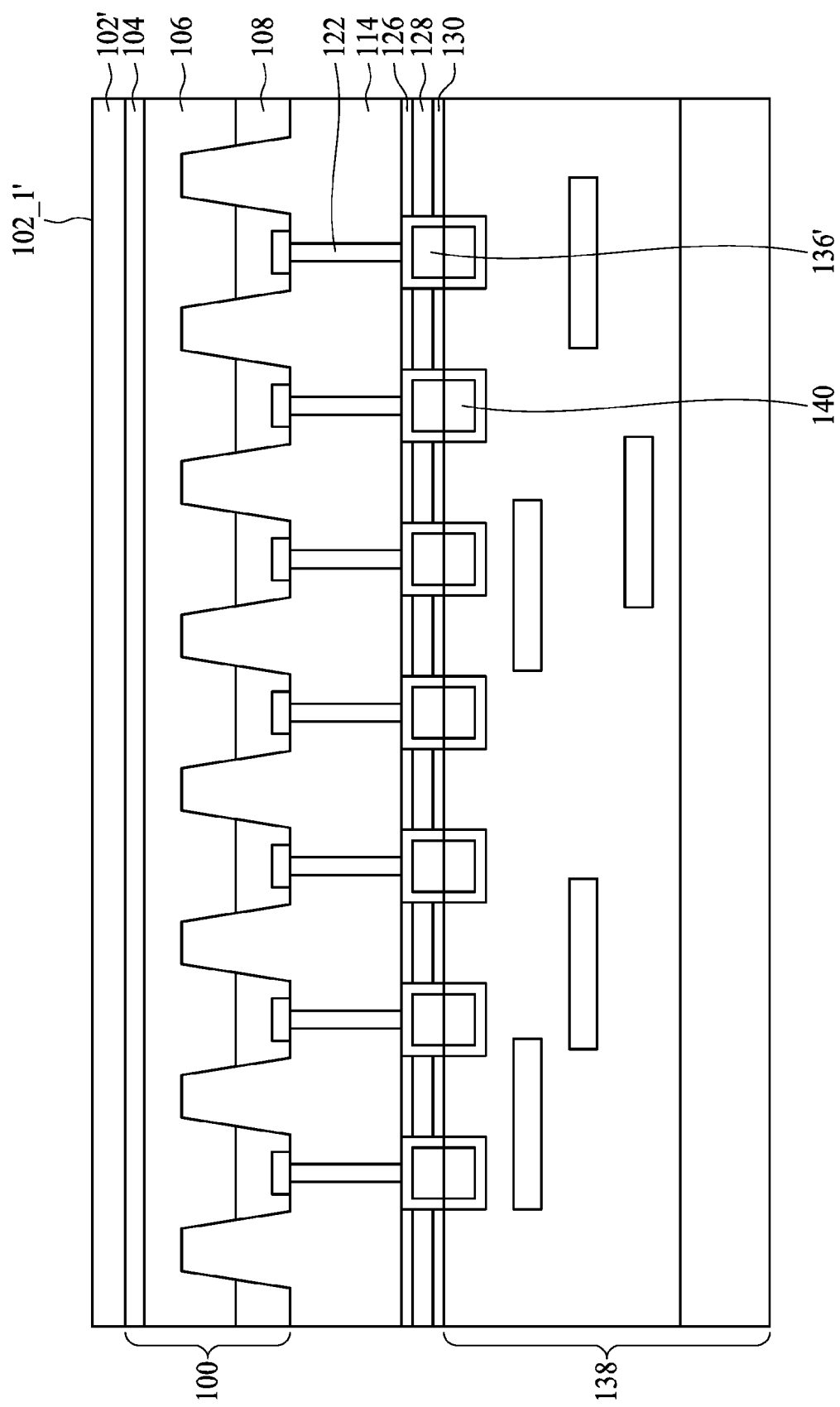

Referring to FIG. 12, after hybrid bonding, the stacking structure of the image sensor array and ROIC 138 is put on a tape (not shown) and a thinning process is performed on a bottom surface 102_1 of the semiconductor substrate 102. The thinning process may include a grinding operation and a polishing operation (such as chemical mechanical polishing (CMP)). After the thinning process, a wet etching operation is performed to remove the defects formed on the bottom surface 102_1' of the semiconductor substrate 102'.

Figure 13A:
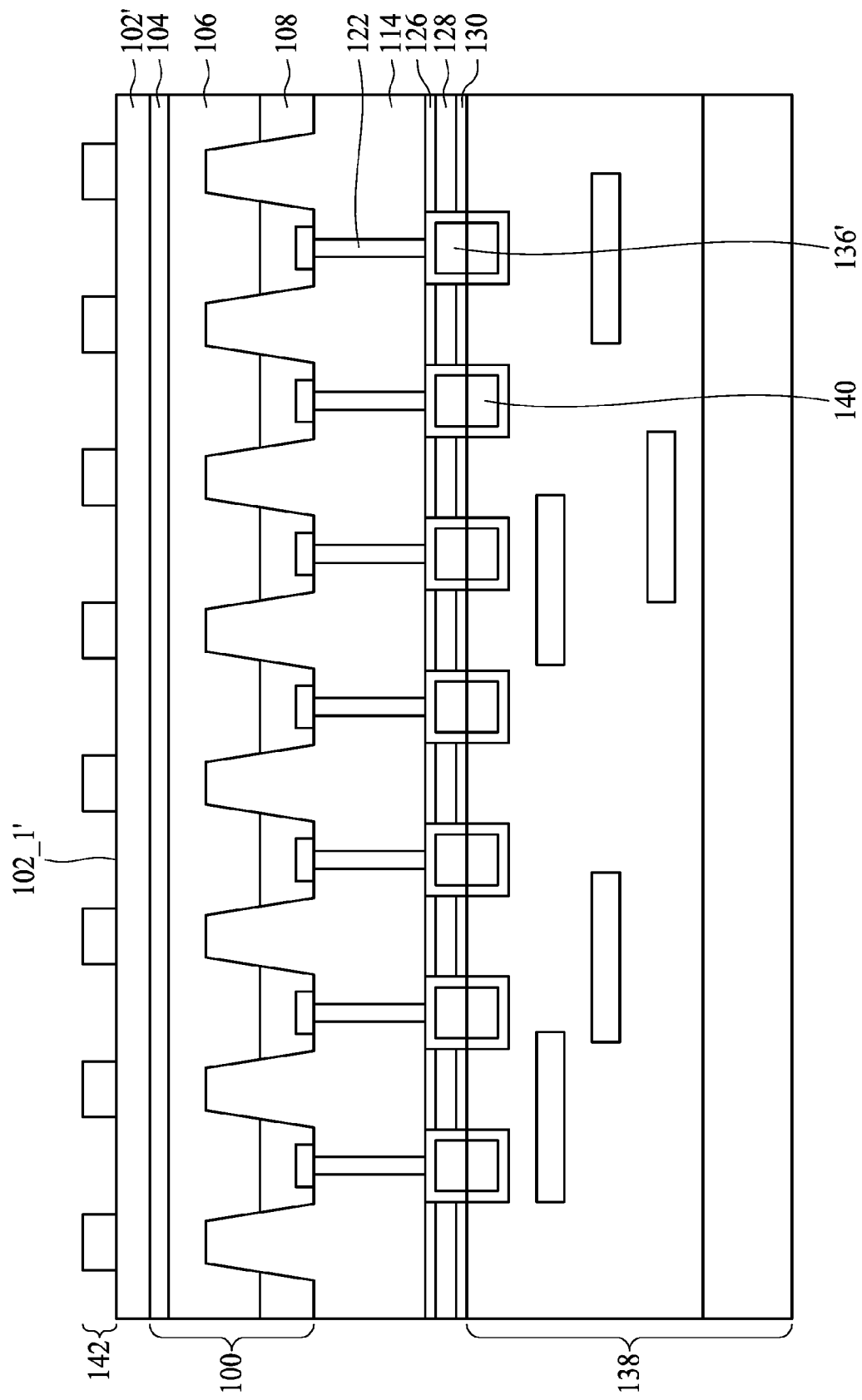
Figure 13B:
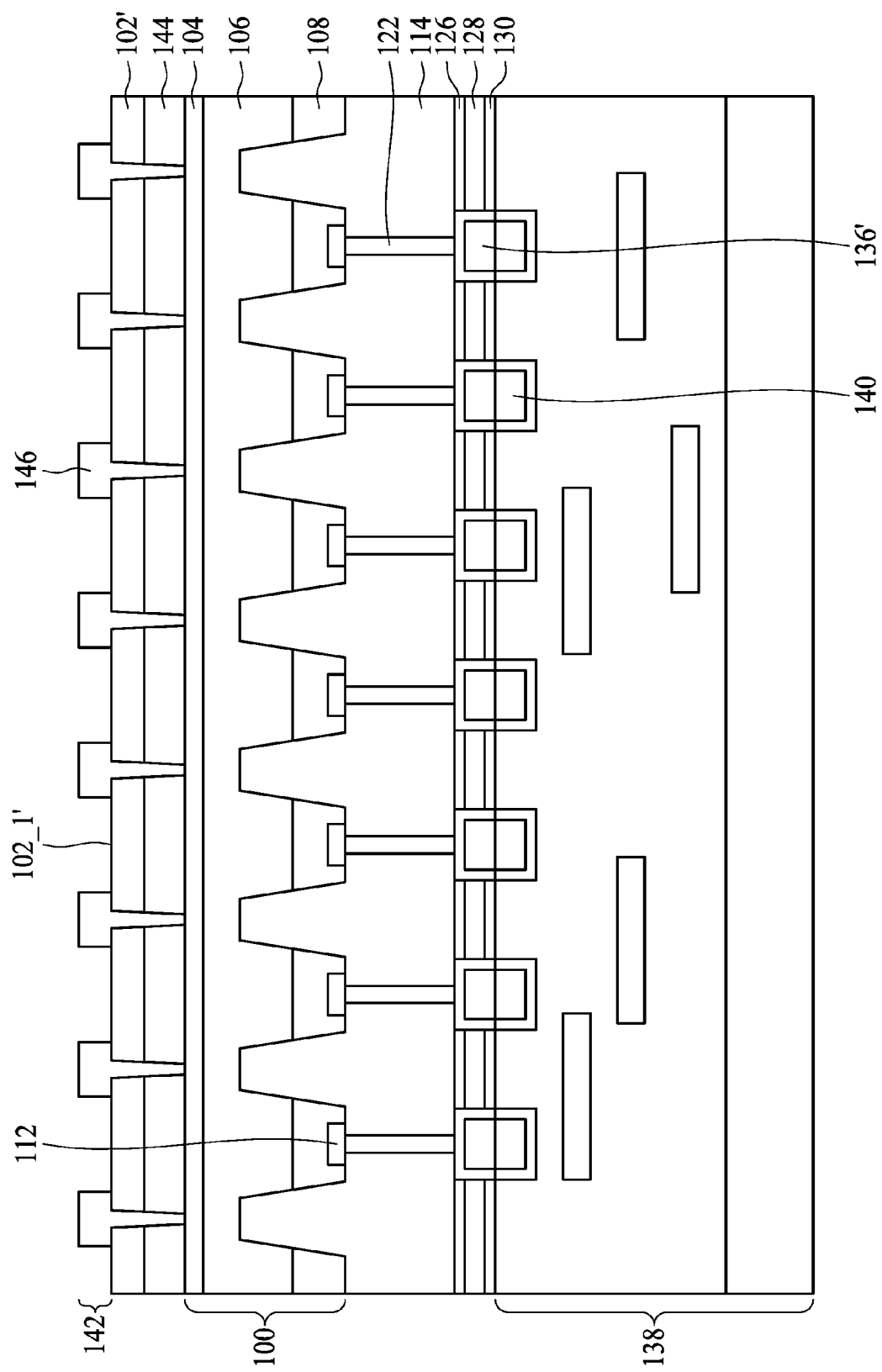

According to an embodiment of the present disclosure, a conductor layer 142 is patterned on the bottom surface 102_1' (i.e. the incoming light side) of the semiconductor substrate 102'. The conductor layer 142 includes a plurality of contacts distanced according to the pixel pitch of the pixels in the p-i-n detector structure 100. In particular, the contacts of the patterned conductor layer 142 are disposed at the positions above the spacers between the p-i-n detector mesa structures as shown in FIG. 13a. In this way, the incoming light is able to transpose the semiconductor substrate 102' and arriving the p-i-n detector structure 100 without being affected by the patterned conductor layer 142. In some embodiments, the patterned conductor layer 142 may include a grid pattern. In some embodiments, the patterned conductor layer 142 may include a slit pattern. According to another embodiment of the present disclosure, the sensor device of FIG. 13a may alternatively include a buffer layer 144 formed between the semiconductor substrate 102' and the first InP layer 104 as shown in FIG. 13b. The contacts of the patterned conductor layer 142 may be further coupled to the first InP layer 104 through contact plugs 146.

Existing indium bumps at the p-i-n detector mesa structures mostly require a large landing area for support, therefore dark current induced by the silicon-metal interface may be serious. The concept of the present disclosure is to provide a novel bonding method and structure for the image sensor array and ROIC 138 to avoid using large landing area and thereby mitigating dark current. Moreover, the bonding strength is ensured by hybrid bonding. The newly proposed contact implant regions may be much smaller than the required landing area in existing structures. In other words, the metal-semiconductor junction area can be smaller to make the dark current smaller. For example, a diameter of each of the contact implant regions 112 in an embodiment may be about 0.1 to about 0.5 microns. However, a landing area required for the same condition may be about 1*1 to about 5*5 $\mu m^2$.

Some embodiments of the present disclosure provide a sensor device. The sensor device includes: a detector having a contact formation region; an insulating layer disposed over the detector; a conductive pad disposed over the insulating layer opposite to a side of the detector; a contact plug formed in the insulating layer for electrically coupling the contact implant region and the conductive pad; and a read-out integrated circuit bonded to the insulating layer through the conductive pad.

Some embodiments of the present disclosure provide an image sensor array. The image sensor array includes: a semiconductor substrate; a detector layer over the semiconductor substrate, wherein the detector layer includes a plurality of sensor pixels and a plurality of contact implant regions built in the top of the sensor pixels; an insulating layer disposed over the detector layer; a plurality of conductive pads corresponding to the plurality of contact implant regions, wherein the conductive pads are disposed over the insulating layer opposite to a side of the detector layer; and a plurality of contact plugs formed in the insulating layer for electrically coupling the contact implant regions and the corresponding conductive pads.

Some embodiments of the present disclosure provide a manufacturing method of a sensor device. The method includes: providing a semiconductor substrate; forming a p-i-n detector structure over the semiconductor substrate; removing a portion of the p-i-n detector structure to form a plurality of isolated p-i-n detectors; forming a plurality of contact formation regions at top of the p-i-n detectors; forming an insulating layer over the p-i-n detectors; forming a plurality of contact plugs in the insulating layer; and forming a plurality of conductive pads over the insulating layer, wherein the conductive pads are coupled to the contact formation regions through the contact plugs.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sensor device, comprising:
   a detector, comprising:
      a layer of first type conductivity;
      an intrinsic layer for absorption of light;
      a layer of second type conductivity opposite to the first type conductivity for carrier collection; and
      a contact formation region in the layer of the second type conductivity;
   an insulating layer disposed over the detector;
   a conductive pad disposed over the insulating layer opposite to a side of the detector;
   a contact plug formed in the insulating layer for electrically coupling the contact formation region and the conductive pad; and
   a read-out integrated circuit bonded to the insulating layer through the conductive pad;
   wherein a top surface of the contact formation region is coplanar with a top surface of the layer of the second type conductivity; and
   a width of the top surface of the contact formation region is less than a width of the top surface of the layer of the second type conductivity.

2. The sensor device of claim 1, wherein the read-out integrated circuit is hybrid bonded to the insulating layer through the conductive pad.

3. The sensor device of claim 1, wherein the detector includes p/intrinsic/n (p-i-n) type conductivity.

4. The sensor device of claim 1, wherein the layer of the first type conductivity and the layer of the second type conductivity include InP or Ge.

5. The sensor device of claim 1, wherein the intrinsic layer includes InGaAs.

6. The sensor device of claim 1, wherein the contact formation region is doped by the second type conductivity.

7. An image sensor array, comprising:
   a semiconductor substrate;
   a detector layer over the semiconductor substrate, wherein the detector layer includes a plurality of sensor pixels and a plurality of contact formation regions built in the top of the sensor pixels;
   an insulating layer disposed over the detector layer;
   a plurality of conductive pads corresponding to the plurality of contact formation regions, wherein the conductive pads are disposed over the insulating layer opposite to a side of the detector layer; and
   a plurality of contact plugs formed in the insulating layer for electrically coupling the contact formation regions and the corresponding conductive pads;
   wherein
   each of sensor pixels includes a layer of first type conductivity, an intrinsic layer for absorption of light, and a layer of second type conductivity opposite to the first type conductivity for carrier collection;
   each of the contact formation regions is formed in the layer of the second type conductivity of the corresponding sensor pixel;
   a top surface of each of the contact formation regions is coplanar with a top surface of the layer of the second type conductivity of the corresponding sensor pixel; and
   a width of the top surface of each of the contact formation regions is less than a width of the top surface of the layer of the second type conductivity of the corresponding sensor pixel.

8. The image sensor array of claim 7, wherein the sensor pixels include p/intrinsic/n (p-i-n) type conductivity.

9. The image sensor array of claim 7, further comprising a semiconductor layer of the first type conductivity at least formed on an interface between sidewalls of the layer of the second type conductivity and the insulating layer.

10. The image sensor array of claim 7, further comprising a plurality of gate electrodes formed between the sensor pixels.

11. The image sensor array of claim 10, further comprising a oxide layer formed between the gate electrodes and the sensor pixels.

12. The image sensor array of claim 7, wherein the layer of the first type conductivity and the layer of the second type conductivity include InP.

13. The image sensor array of claim 7, wherein the intrinsic layer includes InGaAs.

14. The image sensor array of claim 7, wherein the contact formation region is doped by the second type conductivity.

15. The image sensor array of claim 7, further comprising a conductor layer patterned on the semiconductor substrate opposite to a side of the detector layer, wherein the conductor layer includes a plurality of contacts distanced according to a pixel pitch of the sensor pixels in the detector layer.

16. The image sensor array of claim 7, further comprising a buffer layer between the semiconductor substrate and the detector layer.

17. A manufacturing method of a sensor device, comprising:

providing a semiconductor substrate;

forming a layer of first type conductivity over the semiconductor substrate;

forming an intrinsic layer for absorption of light over the layer of the first type conductivity;

forming a layer of second type conductivity for carrier collection over the intrinsic layer;

removing a portion of the intrinsic layer and the layer of the second type conductivity to form a plurality of isolated p-i-n detectors;

forming a plurality of contact formation regions at top of the p-i-n detectors;

wherein a top surface of each of the contact formation regions is coplanar with a top surface of the layer of the second type conductivity of the corresponding p-i-n detector; and a width of the top surface of each of the contact formation regions is less than a width of the top surface of the layer of the second type conductivity of the corresponding p-i-n detector;

forming an insulating layer over the p-i-n detectors;

forming a plurality of contact plugs in the insulating layer; and forming a plurality of conductive pads over the insulating layer, wherein the conductive pads are coupled to the contact formation regions through the contact plugs.

* * * * *